US 6,454,646 B1

(12) United States Patent
Helgenberg et al.

(10) Patent No.: US 6,454,646 B1
(45) Date of Patent: Sep. 24, 2002

(54) PERFORATED AND CORRUGATED ENCLOSURE DOOR FOR COMPUTER CABINET AND METHOD FOR MAKING THE SAME

(75) Inventors: John A. Helgenberg, Paoli, PA (US); Terry W. Louth, Narvon, PA (US); Peter P. Klein, Phoenixville, PA (US)

(73) Assignee: Unisys Corporation, Blue Bell, PA (US)

( * ) Notice: Subject to any disclaimer, the term of this patent is extended or adjusted under 35 U.S.C. 154(b) by 34 days.

(21) Appl. No.: 09/737,235

(22) Filed: Dec. 14, 2000

(51) Int. Cl.[7] .................................. H05K 7/20
(52) U.S. Cl. ..................... 454/184; 361/687; 361/692; 454/195; 454/196
(58) Field of Search ................ 454/184, 195, 454/196; 361/687, 692

(56) References Cited

U.S. PATENT DOCUMENTS

| 173,722 | A | * | 2/1876 | Hayes | |
| 2,817,752 | A | * | 12/1957 | Florence | |
| 3,196,773 | A | * | 7/1965 | Lorenz et al. | |
| 3,679,057 | A | | 7/1972 | Perez | 210/223 |
| 3,719,222 | A | * | 3/1973 | Harding et al. | 160/371 |
| 4,072,142 | A | | 2/1978 | Lof | 126/270 |
| 4,256,472 | A | | 3/1981 | Atkins et al. | 55/269 |
| 4,289,117 | A | | 9/1981 | Butcher | 126/436 |
| 4,514,197 | A | | 4/1985 | Armbruster | 55/316 |
| D331,391 | S | * | 12/1992 | Furuta et al. | |
| 5,275,235 | A | | 1/1994 | Cesaroni | 165/170 |
| 5,287,244 | A | * | 2/1994 | Hileman et al. | 165/247 |
| 5,460,441 | A | | 10/1995 | Hastings et al. | 312/298 |
| 5,502,929 | A | * | 4/1996 | Daniels | 135/95 |
| 5,671,804 | A | | 9/1997 | Kordelin | 165/46 |
| 5,751,550 | A | * | 5/1998 | Korinsky | 361/690 |
| 5,867,956 | A | | 2/1999 | Gregory, Jr. et al. | 52/309 |
| 5,996,292 | A | * | 12/1999 | Hill et al. | 49/57 |
| 6,018,125 | A | | 1/2000 | Collins et al. | 174/35 R |
| 6,032,806 | A | | 3/2000 | Leone et al. | 209/402 |

FOREIGN PATENT DOCUMENTS

JP        58-214745        * 12/1983

* cited by examiner

*Primary Examiner*—Harold Joyce
(74) *Attorney, Agent, or Firm*—Michael B. Atlass; Rocco L. Adornato; Mark T. Starr

(57) ABSTRACT

A door for a computer cabinet and method of constructing the same, with the door comprising a panel that is manufactured from a planar material, that has a corrugated cross-sectional profile, and that defines a plurality of perforations. The panel is adapted for attachment to the computer cabinet.

20 Claims, 6 Drawing Sheets

Sample Perf. ISO View

*Front View Overall Door*

Overall Door

Air Flow & Viewing Insert

*Insert Profile*

ASSUME: $R_1=R_2=R$
$X=8R$
$X/8=R$
LENGTH OF CURVED SECTION $= 2 * (\pi 2R_1)/2 + 2 * (\pi 2R_2)/2$
$= 2\pi R_1 + 2\pi R_2$
$= 4\pi R$
$= 4\pi * X/8$
$= 1/2\pi X$
ASSUME UNIT LENGTH OF 1 FOR X
LENGTH OF CURVED SECTION = 1.57

Sample Perf. ISO View

Sample Perf. Front View

PERFORATED AND CORRUGATED ENCLOSURE DOOR FOR COMPUTER CABINET AND METHOD FOR MAKING THE SAME

BACKGROUND

The invention described in this application relates generally to doors for enclosures joined to computer cabinets. Such enclosures must have sufficient structural integrity to protect the computer components housed within the cabinet from damage caused by physical contact, must provide this physical protection without being unduly bulky or heavy, must allow visibility through the door to enable technicians to check the status of lights and terminal screens without having to open the door, and must allow sufficient airflow through the door, as dictated by the cooling requirements of the computer components. Finally, economic issues come into play, as the door must be constructed and assembled as quickly and cost effectively as possible.

SUMMARY

The invention provides a door for a computer cabinet, with the door comprising a panel that is manufactured from a planar material, that has a corrugated cross-sectional profile, and that defines a plurality of perforations. Means, such as appropriate hinge and lock hardware, are also provided for attaching the panel to the computer cabinet.

The invention also provides a method of constructing a door for a computer cabinet, with the method comprising the following steps. A panel that is manufactured from a planar material is provided, and the panel is corrugated to have a corrugated cross-sectional profile. The panel is perforated to define a plurality of perforations, with the perforations being sized and spaced to provide visibility into the cabinet. A member is secured to the panel, with the member being adapted for attaching the panel to the computer cabinet.

DETAILED DESCRIPTION OF EXEMPLARY EMBODIMENTS

Overview

Figure 1:
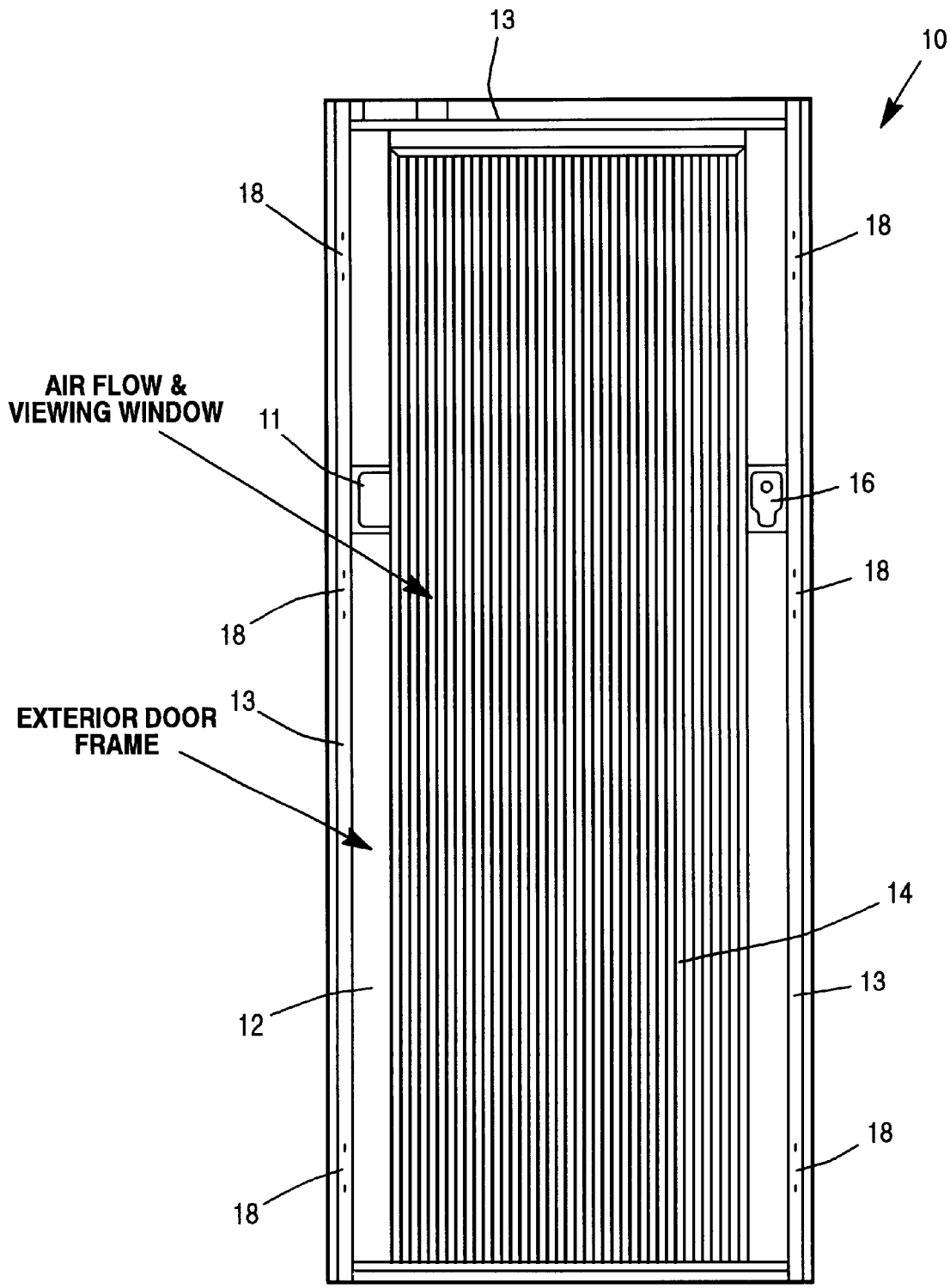
FIG. 1 is a front view of a door constructed in accordance with an illustrative embodiment of the invention.
Figure 2:
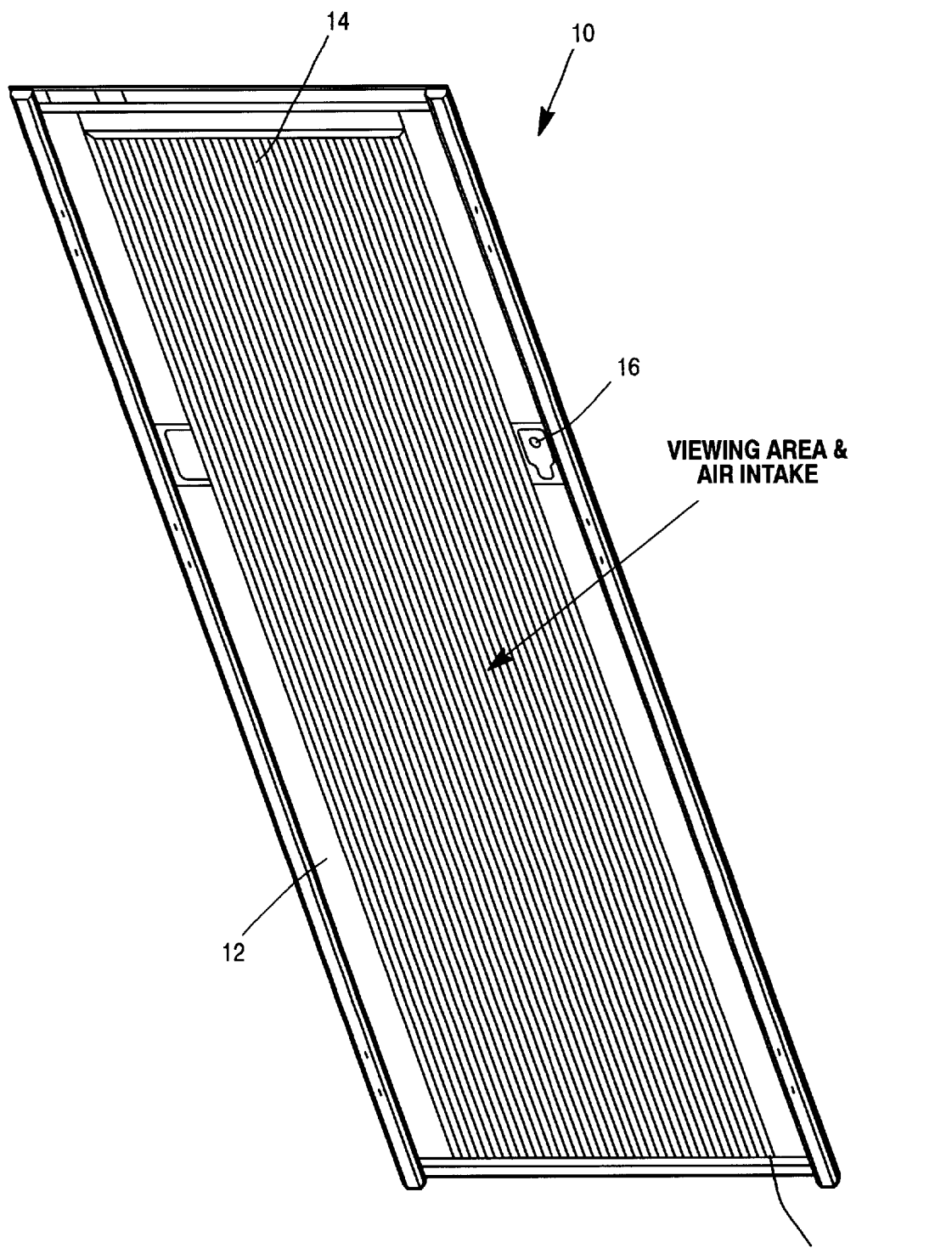
FIG. 2 is a perspective view of the door shown in FIG. 1.
Figure 3:
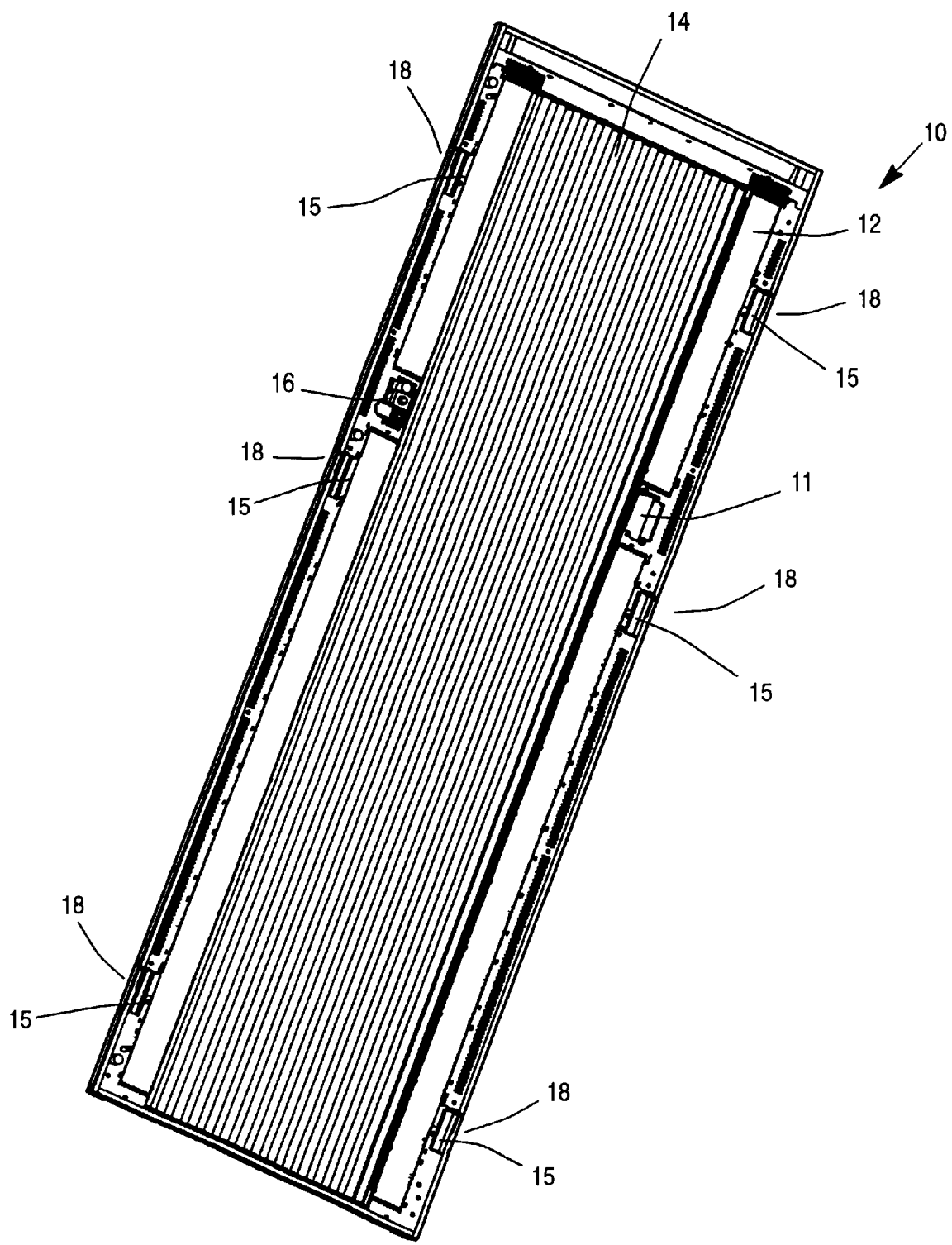
FIG. 3 is a rear isometric view of the door as shown in FIG. 1.
Figure 4:
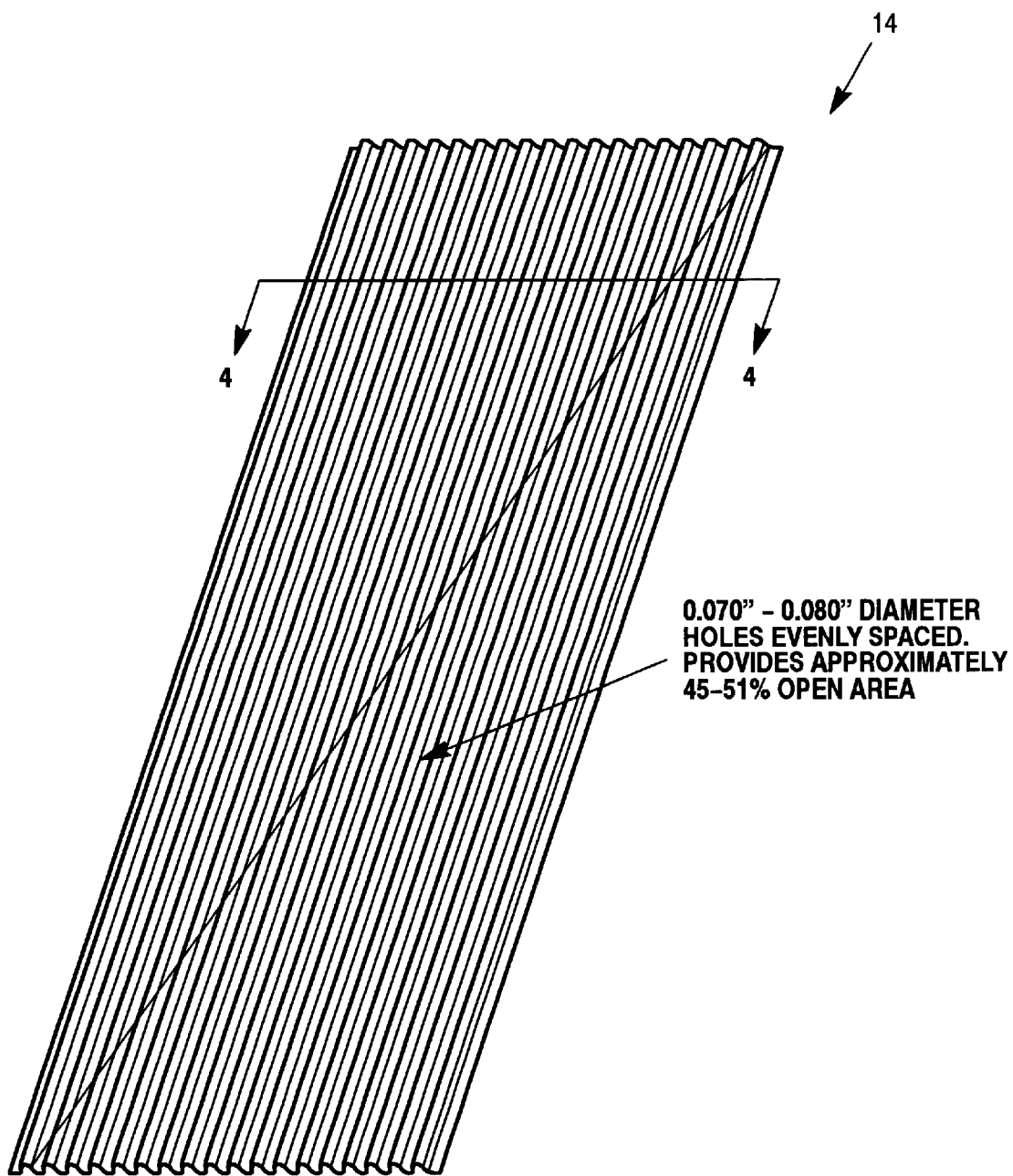
FIG. 4 is a perspective view of the panel portion of the door shown in FIG. 1, but with the panel disassembled from the door.

FIG. 1 is a front view of a door constructed in accordance with an illustrative embodiment of the invention. In order to satisfy all of the above requirements (visibility, security, and airflow), a balance needed to be achieved. A panel 14, which may be centrally located within the overall door 10 design, is allocated for the viewing area and air intake (See FIGS. 1 and 2). The portion of the door 10 other than the panel 14 is designed to aid in the structural integrity and aesthetic appearance of the door 10, for both stand alone systems individually and when existing with legacy cabinetry. The door 10 must also attach and lock securely to the cabinet frame to promote physical security.

Several materials were considered for the panel 14 portion of the door 10. Transparent Lexan® plastic has been used to construct such door 10s, and Lexan® doors allowed customers to view components, lights, and/or terminal screens while the door was closed and secure. Lexan® was initially considered since it greatly supported the visibility requirement, but for a Lexan® door to provide adequate airflow, it would have to be perforated to define numerous perforations. Also, Lexan® is relatively difficult to fabricate into manufactured items. These shortcomings of Lexan® led to a search for other materials and processes.

Other non-transparent, molded materials did not offer the viewing capability provided by Lexan®. However, customer dissatisfaction with these configurations and materials has created the demand to design a door 10 that maintained viewing capability while meeting the above design requirements. An optimal design and material should provide a sufficient opening to meet the airflow requirements dictated by the components inside the cabinet. Additionally, the design and material should maintain external structural integrity while still allowing viewing capability. The door 10 should also occupy a minimal amount of space, which is at a premium in computer room environments.

Preferably, the panel 14 is constructed from a planar material that has structural integrity, is easily fabricated, relatively thin, and is able to contain a vast amount of open area (perforations). An illustrative material is perforated sheet metal, which is readily available, comes in a variety of thicknesses and shapes, and can readily be perforated with numerous perforations of various sizes and shapes. A sheet metal design allows for a quick time to market solution with relatively low initial startup costs. Other materials, such as Lexan®, may be suitable on other applications.

Figure 5:
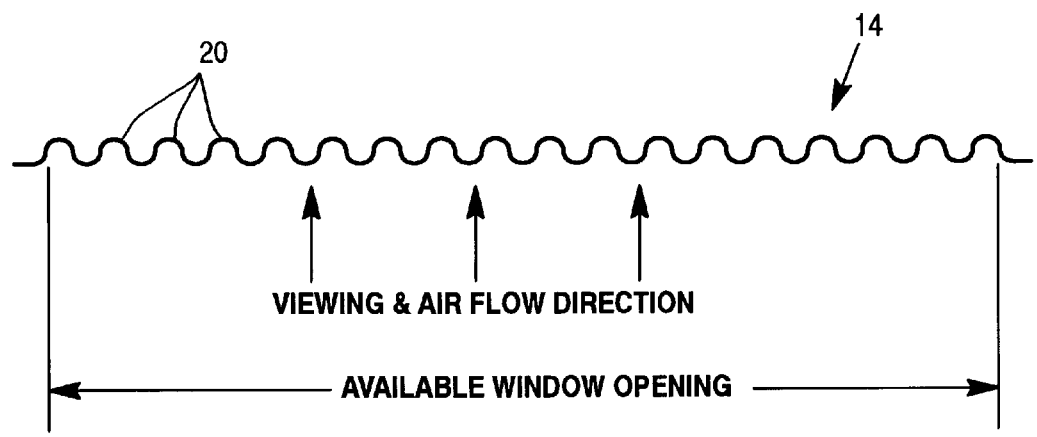
FIG. 5 is a cross-section of the panel shown in FIG. 3, taken along the line 4—4 in FIG. 3.
Figure 6:
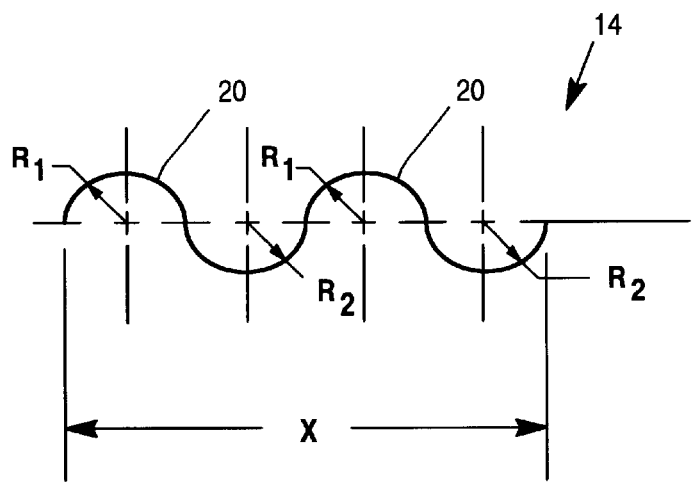
FIG. 6 is a detailed view of the cross section shown in FIG. 4.

Regarding airflow, the best solution would be a 100% open area. However, as soon as any material is added, such as to promote structural integrity, the open area decreases correspondingly. Accordingly, it is necessary to develop a profile that reaches a compromise between maximizing the surface area available for airflow and staying within the allowable window size. The developed profile adds additional surface area by creating thickness to the two dimensional window. The additional surface area can be added by creating rolls or corrugations 20 in the material (See FIG. 5). Using a rolled profile, the surface area for airflow increases by approximately 57% (See FIG. 6). The developed curved profile creates a balance between thickness of the profile, aesthetics, and viewing capability. While the size of the curve radius can be varied resulting in the same surface area, it was found that a size of approximately 0.25" produced a visually appealing contour. Smaller dimensions produced various shadows and created a distorted image when viewing objects. Larger dimensions would start to increase the thickness of the door 10.

Figure 7:
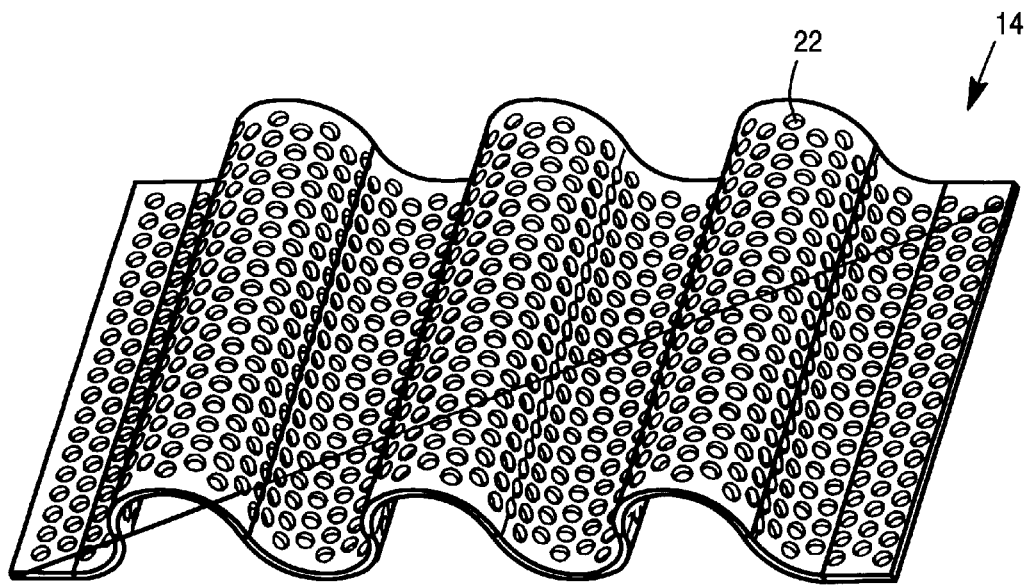
FIG. 7 is an isometric view of a portion of the panel shown in FIG. 3.
Figure 8:
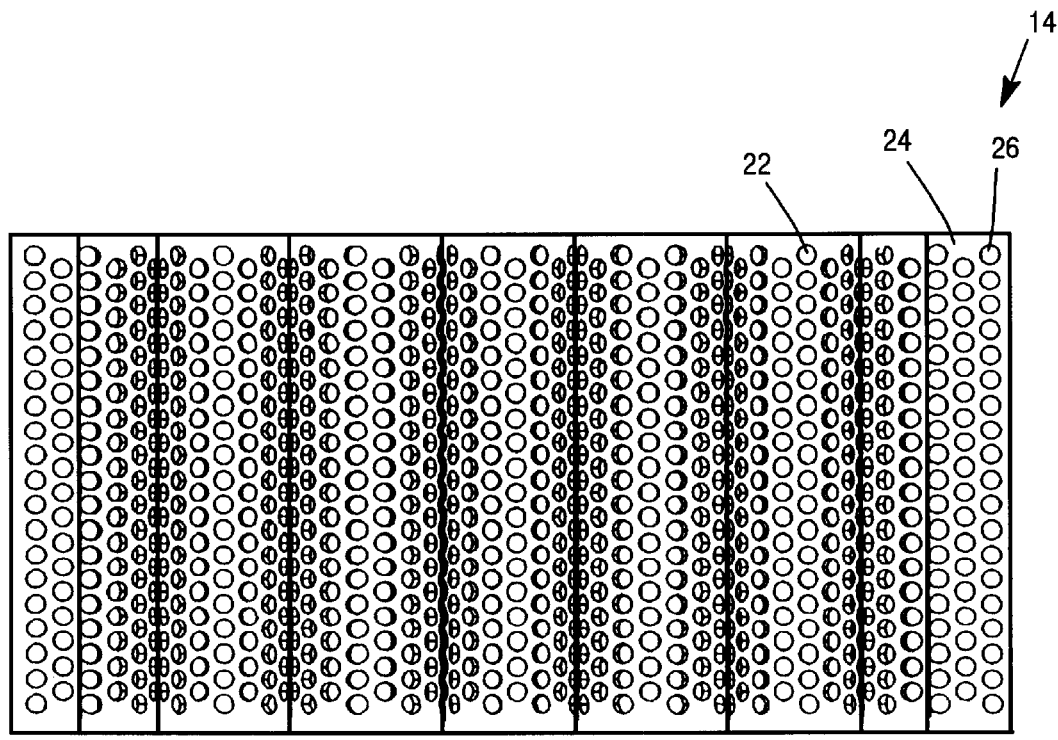
FIG. 8 is a front view of a portion of the panel shown in FIG. 3.

Airflow is enhanced by adding perforations to the curved surface. See FIGS. 7 and 8; for clarity, FIGS. 1–6 omit the perforations 22. The perforations not only provide a path for airflow, but they also provided the "windows" through which objects in the computer cabinet can be viewed from the outside of the door 10. As the "windows" become evenly spaced and properly sized, the base material appears to be translucent. This characteristic, coupled with viewing angles, distances, and the contrast of objects behind the door 10, makes the viewing area appear to take on a transparent quality. A variety of perforation sizes have been tested. The optimum opening size to maximize airflow was found to be an approximately 63% open pattern. This translates to a uniform pattern of 5/32" diameter perforations staggered on a 3/16" center. A 63% opening provides approximately the same open area as the original window opening. Any perforation larger than 63% open would not be able to provide additional airflow since the flow would be "choked" or limited by the initial opening size.

The 63% open material (5/32" diameter perforations staggered on a 3/16" centers) was tested visually along with a variety of other perforations with corresponding open percentages. The emphasis at this stage was to achieve the best visually acceptable perforation size. The 5/32" diameter perforations created distortions due to the relatively large perforation size verses the material web remaining between the perforations. The perimeter outline of the perforations was prevalent to the viewer. As the perforation became smaller, this phenomenon decreased. A smaller perforation resulted in a less noticeable outline. Larger perforation diameters (although smaller overall percentage open due to spacing) were also tested. The larger perforations accentuated the above visibility problem. Testing concluded that, in this particular environment, a preferable viewing material consisted of perforation diameters in the 0.070"–0.080" diameter range on staggered centers, which provided approximately 45–51% opening. It should be understood that in other environments or circumstances, such as using a planar material other than sheet metal, other diameter and spacing parameters may be preferable.

The door 10 provides a level of security found with solid doors while enabling users or technical support personnel to view components through the door 10 without opening the door 10. The combination of perforation size/spacing and curved material allow more airflow than could normally be achieved in the current industry standard door designs. The perforation spacing and perforation size coupled with the curved profile of the viewing area create a translucent appearance. These advantages allow users to place more components requiring more airflow behind a door 10 than previously possible due to airflow restrictions. It also allows the users to view indicators or components within the cabinet without having to open the door 10.

DETAILED DESCRIPTION OF ILLUSTRATIVE EMBODIMENTS

Referring in more detail to FIG. 1, the invention provides a door 10 for a computer cabinet 13, with the door 10 comprising an exterior frame 12, and a panel 14 that is joined to the panel 14 using methods known in the art, such as spot welding, bolting, etc. In some applications, frame 12 and panel 14 can be manufactured as a combined, integrated panel 14 whose vertical periphery are adapted to attach to computer cabinet 13 without using a separate frame 12. However, in most applications, a separate rigid frame 12 is required to support the panel 14. Panel 14 is manufactured from a planar stock material, which is processed according to the invention to have a corrugated cross-sectional profile and to define a plurality of perforations 22, as described below.

Various means can be provided for attaching the door 10 to the computer cabinet 13. In the illustrative but not limiting embodiment shown in FIG. 1, computer cabinet 13 includes a plurality of hinge locations 18 disposed on both vertical sides of computer cabinet 13, so that the door 10 can be mounted to swing from either side of computer cabinet 13. The door 10 attaches to the computer cabinet 13 at three hinge locations 18. Since the door 10 is reversible and can swing from either side, there are a total of six hinge locations 13 (3 per side). In the illustrative embodiment shown in FIG. 3, members, such as flat plates 15 defining an aperture or slot, are attached to the door 10, and hinge members are attached to the computer cabinet 13. However, separate flat plates 15 are not absolutely necessary; the aperture or slot may be provided directly in the frame 12 in some applications.

Turning to the computer cabinet 13, a suitable hinge member is a pin or other protrusion extending from the computer cabinet 13 to engage the aperture or slot in the flat plate 15 mounted to the door 10. The weight of the door 10 keeps the pin or protrusion seated in the aperture or slot. When the door 10 is shut, the geometry of the frame 12 relative to the computer cabinet 13 does not allow the door 10 to be lifted off the pin or protrusion, thereby promoting security and integrity.

It should be understood that in some applications, it may be possible to provide the frame 12 with an extension, and in that case, the computer cabinet 13 is adapted to receive the extension.

Other suitable attaching means can include any hardware, such as a conventional folding hinge (not shown) that is appropriate for pivotally attaching the panel 14 (with or without a separate frame 12) to the computer cabinet 13 so that the panel 14 can swing between an open position and a closed position. The attaching means can also include the locking hardware 16 for securing, and locking if necessary, the panel 14 in a closed position to promote structural integrity of the cabinet and security of the computer components within the cabinet. Each vertical side of frame 12 includes a respective recess adapted to receive locking hardware 16. As understood by those skilled in the art, the locking hardware 16 is placed on the vertical side opposite the side by which the door 10 is hinged to the computer cabinet 13. Blank cover 11 can be placed in the recess not occupied by locking hardware 16. The attaching means is adapted to position the panel 14 relative to the computer cabinet 13 so as to dispose the panel 14 orthogonally relative to an airflow passing through the panel 14 into the computer cabinet 13. See FIG. 5. In other words, the panel 14 is positioned so that ambient airflow passes from outside the cabinet 13 through the panel 14 along a line that is substantially normal to the plane of the panel 14 and into the cabinet 13.

As discussed above, the panel 14 defines a plurality of perforations 22 so as to define an open area representing the cumulative areas of each of the perforations 22, and in an illustrative but not limiting embodiment of the invention, the open area has an area characteristic ranging from approximately 45% to approximately 51% of a total area of the panel 14. See FIGS. 7 and 8. Continuing the illustrative embodiment, each of the perforations 22 has a diameter ranging from approximately 0.070" to approximately 0.080". The perforations 22 can be arranged into a plurality of parallel rows 24 and 26, with adjacent ones of the rows 24 and 26 are staggered relative to one another.

The panel 14 has a plurality of corrugations 20, with each of the corrugations 20 having a radius of curvature of approximately 0.25". See FIG. 6.

The panel 14 can be constructed from a planar material, such as sheet metal having a thickness ranging from approximately 20 gage (0.0359") to approximately 16 gage (0.0598"). Other materials may be appropriate in certain applications, such as Lexan®, fiberglass, or polymeric materials. Those skilled in the art will recognize that suitable planar materials can be chosen based on criteria such as durability, availability, cost, and ease of machining/manufacturing, where analysis of the material against those criteria suggests that that material has characteristics comparable to sheet metal.

Method of Construction

The invention also provides a method of constructing the door 10 described above, with the method comprising the steps of providing a panel 14 manufactured from a planar material, corrugating the panel 14 to have a corrugated cross-sectional profile, perforating the panel 14 to define a plurality of perforations 22, and adapting the panel 14 to be attached to the computer cabinet 13.

In an illustrative embodiment of the invention, the step of corrugating includes corrugating the panel 14 to have a plurality of corrugations 20, with each of the corrugations 20 having a radius of curvature of approximately 0.25". The step of corrugating can be performed using any suitable method known by those skilled in the art, and the specific method of corrugating is not critical to practicing the invention.

Continuing with the illustrative embodiment of the invention, the step of perforating the panel 14 includes defining a plurality of perforations 22 in the panel 14 so as to define an open area representing cumulative areas of each of the perforations 22, and wherein the open area has an area characteristic ranging from approximately 45% to approximately 51% of a total area of the panel 14. A plurality of perforations 22 can be defined in the panel 14, with each of the perforations 22 having a diameter ranging from approximately 0.070" to approximately 0.080". The perforations 22 in the panel 14 can be arranged into a plurality of parallel rows 24 and 26, with adjacent ones of the rows 24 and 26 being staggered relative to one another. The step of perforating can be performed using any suitable method known by those skilled in the art, and the specific method of perforating is not critical to practicing the invention. Those skilled in the art will recognize that the steps of perforating and corrugating can be done in any convenient order, and will also recognize that these two steps need not be done at the same facility or physical plant.

The step of adapting can include altering the panel 14 itself to be attached directly to the computer cabinet 13, assuming the periphery of the panel 14 is sufficiently ruggedized to withstand such attachment. Alternatively, at least one separate member can be securing to the panel 14, this member being suitable for engaging the computer cabinet 13. This separate member can include at least one of the following: a separate frame 12 secured to at least a portion of the periphery of the panel 14, hardware such as the above flat plate 15 attached to either the frame 12 or to the panel 14, suitable folding hinges, and locking hardware 16, and the various members appropriate for joining the above hardware together.

It is to be understood that the above discussion is intended to describe and illustrate, but not to limit, the invention. Accordingly, those skilled in the art will understand that various modifications, substitutions, or alterations of the items and method steps described above may be possible without departing from the scope of the invention, which is defined by the following claims.

We claim:

1. A door for a computer cabinet, the door comprising:
   a panel being manufactured from a planar material, having a corrugated cross-sectional profile, and defining a plurality of perforations, the perforations being sized and spaced to provide visibility into the cabinet; and
   means for attaching the panel to the computer cabinet.

2. The door of claim 1, wherein the panel defines a plurality of perforations so as to define an open area representing cumulative areas of each of the perforations, and wherein the open area has an area characteristic ranging from approximately 45% to approximately 51% of a total area of the panel.

3. The door of claim 1, wherein the panel defines a plurality of perforations, each of the perforations having a diameter ranging from approximately 0.070" to approximately 0.080".

4. The door of claim 1, wherein the panel defines a plurality of perforations that are arranged into a plurality of parallel rows, and wherein adjacent ones of the rows are staggered relative to one another.

5. The door of claim 1, wherein the panel has a plurality of corrugations, each of the corrugations having a radius of curvature of approximately 0.25".

6. The door of claim 1, wherein the panel is constructed of sheet metal.

7. The door of claim 1, wherein the panel is constructed of a planar material having a thickness ranging from approximately 20 gage (0.0359") to approximately 16 gage (0.0598").

8. The door of claim 1, wherein the attaching means are adapted to position the panel relative to the computer cabinet so as to dispose the panel orthogonally relative to an airflow passing through the panel into the computer cabinet.

9. A door for a computer cabinet, the door comprising:
   a panel being manufactured from a planar material, having a corrugated cross-sectional profile, and defining a plurality of perforations, the perforations being sized and spaced to provide visibility into the computer cabinet; and
   a frame joined to the panel and adapted to engage the computer cabinet.

10. The door of claim 9, wherein the frame defines one of an aperture and a slot, and wherein the frame is adapted to receive a extension provided by the computer cabinet.

11. The door of claim 9, wherein the frame provides an extension, and wherein the computer cabinet is adapted to receive the extension.

12. The door of claim 9, further comprising a member joined to the frame, the member being adapted to engage the computer cabinet.

13. The door of claim 12, wherein the member defines an aperture adapted to receive a pin extending from the computer cabinet.

14. A method of constructing a door for a computer cabinet, the method comprising the steps of:
   providing a panel being manufactured from a planar material;
   corrugating the panel to have a corrugated cross-sectional profile;
   perforating the panel to define a plurality of perforations, the perforations being sized and spaced to provide visibility into the cabinet; and
   adapting the panel to be attached to the computer cabinet.

15. The method of claim 14, wherein the step of providing a panel includes providing a panel having a thickness ranging from approximately 20 gage (0.0359") to approximately 16 gage (0.0598").

16. The method of claim 14, wherein the step of providing a panel includes providing a panel manufactured from sheet metal.

17. The method of claim 14, wherein the step of corrugating the panel includes corrugating the panel to have a plurality of corrugations, each of the corrugations having a radius of curvature of approximately 0.25".

18. The method of claim 14, wherein the step of perforating the panel includes defining a plurality of perforations in the panel so as to define an open area representing cumulative areas of each of the perforations, and wherein the open area has an area characteristic ranging from approximately 45% to approximately 51% of a total area of the panel.

19. The method of claim 14, wherein the step of perforating the panel includes defining a plurality of perforations in the panel, each of the perforations having a diameter ranging from approximately 0.070" to approximately 0.080".

20. The method of claim 14, wherein the step of perforating the panel includes defining a plurality of perforations in the panel that are arranged into a plurality of parallel rows, and wherein adjacent ones of the rows are staggered relative to one another.

* * * * *